United States Patent [19]

Nishikawa

[11] 4,420,207
[45] Dec. 13, 1983

[54] SOCKET HAVING MEANS OF NO-LOAD ENGAGING WITH AND RELEASING FROM ELECTRONIC UNIT

[75] Inventor: Kinichi Nishikawa, Tokyo, Japan

[73] Assignee: Yamaichi Electric Mfg. Co., Ltd., Tokyo, Japan

[21] Appl. No.: 263,507

[22] Filed: May 14, 1981

[30] Foreign Application Priority Data

May 28, 1980 [JP] Japan .............................. 55-73558[U]

[51] Int. Cl.³ ............................................ H01R 13/62
[52] U.S. Cl. .............................. 339/75 M; 339/17 CF; 339/176 M
[58] Field of Search .......... 339/17 CF, 75 M, 75 MP, 339/176 M, 176 MP, 91 R; 220/307, 324, 326

[56] References Cited

U.S. PATENT DOCUMENTS

| 2,679,947 | 6/1954 | Piker et al. | 220/326 |
| 3,750,085 | 7/1973 | Cooper | 339/75 M |
| 4,245,877 | 1/1981 | Auriana | 339/74 R |
| 4,245,879 | 1/1981 | Buck | 339/91 R |

FOREIGN PATENT DOCUMENTS

| 1366928 | 9/1974 | United Kingdom | 339/75 MP |
| 2039160 | 7/1980 | United Kingdom | 339/75 M |

Primary Examiner—John McQuade
Attorney, Agent, or Firm—Wenderoth, Lind & Ponack

[57] ABSTRACT

A socket for electronic unit includes a base plate having two rows of openings to receive lead wires of the unit and a connector plate having two rows of contacts each engageable with the lead wire. The base plate is movable vertically between a lead wire engagement position and a release position. Each contact moves laterally to contact with the lead wire by downward urging force of the base plate. Lock members having finger operating release portions engage with retainers of the connector plate and can be disengaged by longitudinally inward urging force of fingers. Thus, engagement and disengagement of the electronic unit can be performed by one operation.

5 Claims, 15 Drawing Figures

SOCKET HAVING MEANS OF NO-LOAD ENGAGING WITH AND RELEASING FROM ELECTRONIC UNIT

BACKGROUND OF THE INVENTION

The present invention relates to a socket having means for no-load engaging with and releasing from an electronic unit, and more especially to a socket for an electronic unit having many lead wires and including a base plate having at least one row of vertical openings each receiving one of the lead wires which is engageable with a contact, a connector plate having at least one row of said contacts and means to allow relative movement between the base plate and the connector plate between contact engagement and release positions.

Such socket is known from Japanese Utility Model Application Publication No. 49978/1977. A movable plate of a socket supports all lead wires of an IC package by lead wire receiving through holes. The movable plate is moved laterally from a release position to a contact engagement position to urge side surfaces of the lead wires into engagement with contacts.

Japanese Laid-Open Patent Publication No. 88987/1978 (U.S. patent application Ser. No. 755,759, Mark Auriana, now U.S. Pat. No. 4,245,877) also describes a socket of generally similar construction as the above described publication.

Because the movable plate moves laterally relative to the connector plate, the lead wires of the electronic unit, e.g., the IC package, must move laterally to engage with and release from contacts. As the IC package has many lead wires, the frictional force between lead wires and the contacts is relatively large so that the force for moving the movable plate requires the lever action of a handle or tool. Thus, when the IC packages are frequently engaged and disengaged such as during an inspection procedure, the operations are not easily performed. Further, lead wires tend to break off due to the lateral force required to engage and disengage the wires with and from the contacts. Further, two operations are necessary, i.e., of lever operation and an IC package pick up or engaging operation. Thus, the finger position of the operator must be changed accordingly. When many IC packages are to be handled, such two operations result in low efficiency, erroneous work and also fatigue.

SUMMARY OF THE INVENTION

Accordingly the object of the present invention is to eliminate or at least mitigate the above-described disadvantages and to provide a socket of the above-described type having means to move the base plate vertically relative to the connector plate between engagement and disengaged positions of the contacts.

Another object of the present invention is to provide a socket having means to move the base plate vertically relative to the connector plate and means to engage and disengage the electronic unit, e.g., the IC package, in one operation without changing the finger position of the operator.

As the base plate only moves vertically, lateral force is not applied to the lead wires and frictional sliding movement of the lead wires is completely eliminated. Thus, the service life of the electronic unit and the socket is increased.

To lock the base plate with the connector plate, lock members having finger operating release portions are mounted on the base plate and engage with retainers mounted on the connector plate. Thus, to engage the base plate, one pushing operation engages the lock member with the retainer, and to release the base plate, an urging force in the longitudinal direction of the fingers of the operator release the lock members from the retainer and the fingers can also pick up the electronic unit from the base plate.

The invention will be described in more detail hereinafter with reference to the accompanying drawing which is given solely by way of example.

DETAILED DESCRIPTION OF PREFERRED EMBODIMENT

Figure 1:
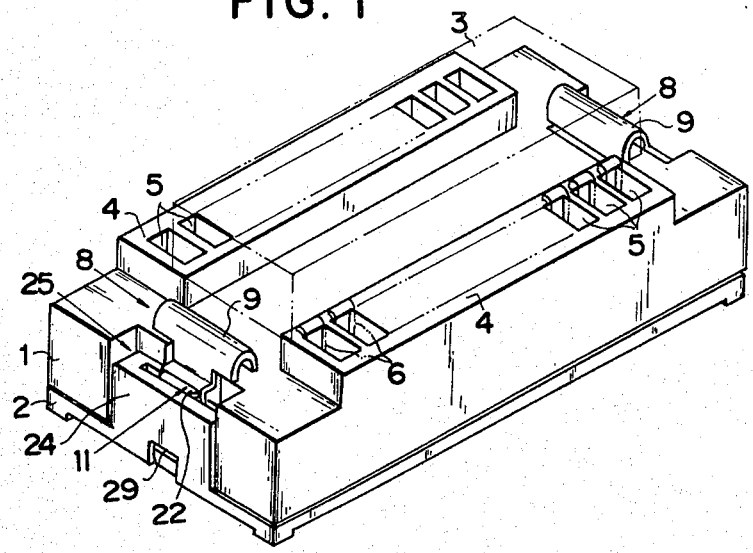
FIG. 1 is a perspective view of a connector socket, according to the present invention.
Figure 2:
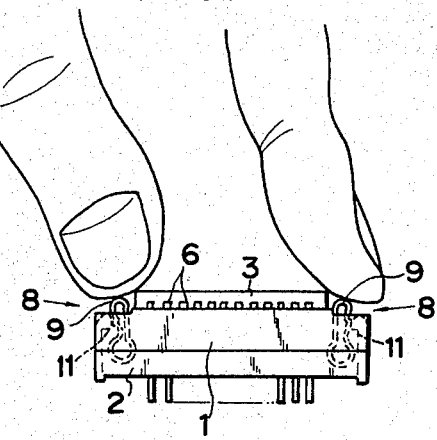
FIG. 2 is an illustration of the connector socket shown in FIG. 1 to engage with an IC package.
Figure 3:
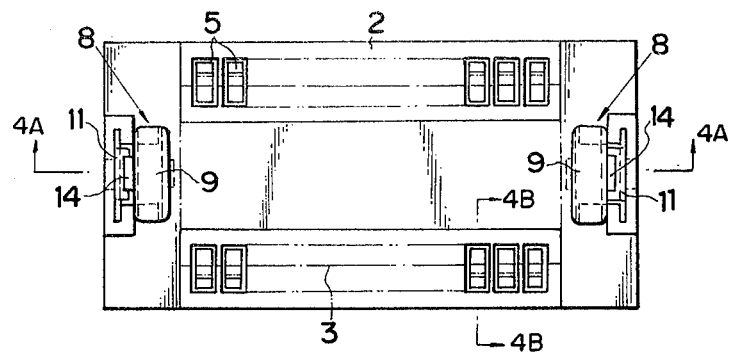
FIG. 3 is a plan view of the connector socket shown in FIG. 1.

Referring now to the drawings, an electric connector socket, according to the present invention comprises a base plate 1 and a connector plate 2. An electronic unit, e.g. an IC package 3 is placed on the base plate 1. The base plate 1 has thereon a pair of package rests 4 which have a number of through holes 5 therein through which lead wires 6 of the IC package 3 pass when the package 3 is placed on the rests 4. The connector plate 2 has many contacts 7 thereon one corresponding to each through hole 5. Each lead wire 6 passes into the through hole 5 and contacts one contact 7 when the IC package 3 is placed on the base plate 1 as will be described more fully hereinafter.

The base plate 1 has a pair of lock members 8 which are secured to the base plate 1 at longitudinal ends thereof and which project upwardly from the base plate 1. Each lock member 8 is elastically deformable in the longitudinal direction of the base plate and the upwardly projecting portion constitutes a finger operating portion 9. The connector plate 2 has at both longitudinal ends a pair of engaging recesses 10 which receive the lock members 8. On each recess wall is mounted a retainer 11 which engages with the lock member 8.

When the base plate 1 is placed on the connector plate 2, the lock members 8 pass into the recesses 10 and are locked by the retainers 11 by the outward elastic force of the lock members. Thus the base plate 1 is secured to the connector plate 2. When the finger operating portions 9 are urged longitudinally inwardly the lock members 8 are elastically bent to release them from the retainers 11.

Figure 8A:
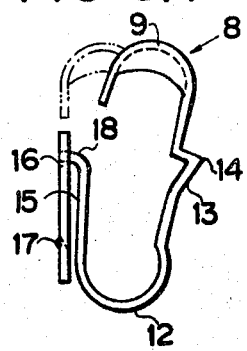
FIG. 8A is an enlarged side view of an elastic lock member.
Figure 8B:
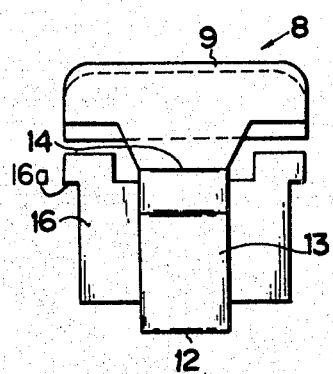
FIG. 8B is a right end view of the member of FIG. 8A.
Figure 8C:
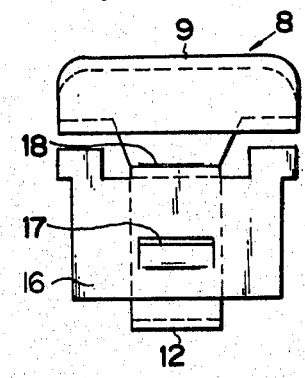
FIG. 8C is a left end view of the member of FIG. 8A.

The elastic lock member 8 is shown in detail in FIGS. 8A, B and C. An elastic metal plate, e.g. berylium copper plate is stamped and bent into a generally U-shape about base portion 12. One leg of the U is formed into a lock element 13 which has an engaging step portion 14 which engages with the retainer 11. The free end of the lock element 13 is bent into a reverse U shape and forms a smooth finger operating portion 9. The other leg has an attaching portion 15 and is bent rather sharply into a bent portion 18 to form flat attaching element 16. By means of the bent portions 12 and 18, the lock element 13 and the finger operating portion 9 maintain good elasticity after repeated operations.

Figure 6:
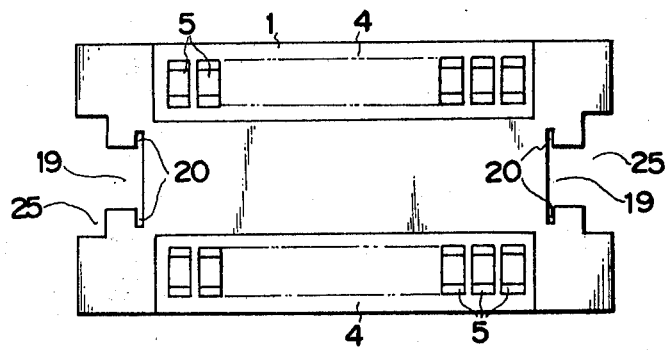
FIG. 6 is a plan view of the base plate.

As shown in FIG. 6, the longitudinal ends of the base plate 1 have lock member mounting recesses 19 therein, each of which has lock member receiving grooves 20 in the inner end thereof. Each lock member 8 is pushed into the corresponding recess 19 with the attaching element 16 received in the corresponding grooves 20. Shoulder portions 16a of the attaching element 16 contact with the upper surface of the base plate 1 and retainer pawl 17 projecting out of the surface of each element 16 engages a corresponding recess formed in the wall of the base plate 1 defining the recess 19. Thus, the lock members 8 are firmly mounted to on the base plate 1.

Figure 7:
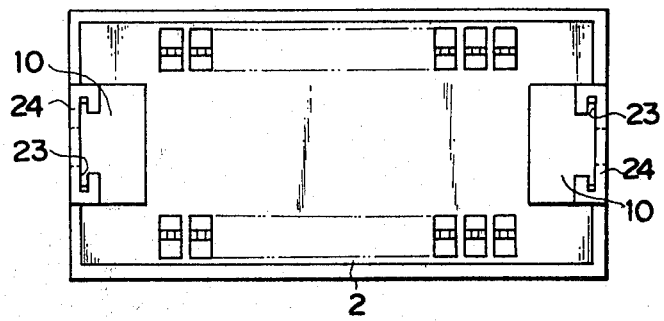
FIG. 7 is a plan view of the connector plate.
Figures 9A, 9B:
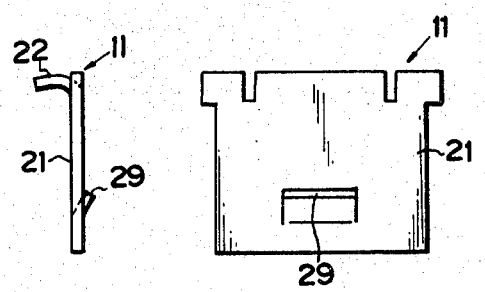
FIG. 9A is an enlarged side view of the retainer.
FIG. 9B is a right end view of the retainer of FIG. 9A.
Figure 9C:
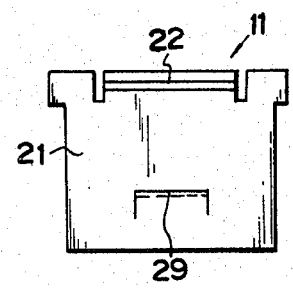
FIG. 9C is a left end view of the retainer of FIG. 9A.

As shown in FIGS. 9A, 9B and 9C, the retainer 11 is formed by a metal plate having a flat attaching element 21 and a retainer element 22 which is bent over at upper end of the attaching element 21. As shown in FIG. 7, the connector plate 2 has two engaging recesses 10 or openings in the embodiment shown, and upwardly projecting guide walls 24 at both longitudinal ends. Each guide wall 24 has a retainer receiving groove 23. The retainer 11 is pushed into the retainer receiving grooves 23 until retainer pawl 29 formed on the attaching element 21 engages in a recess formed in the guide wall 24. The retainer element 21 projects into the engaging recess 10, and the retainer 11 is firmly mounted on the connector plate.

As shown in FIG. 6, a portion of the mounting recess 19 of the base plate 1 is widened to form guide recesses 25. The guide recesses 25 are shaped to slidably fit over the guide walls 24 of the connector plate 2 and accurately position the base plate 1 on the connector plate 2.

Figure 4A:
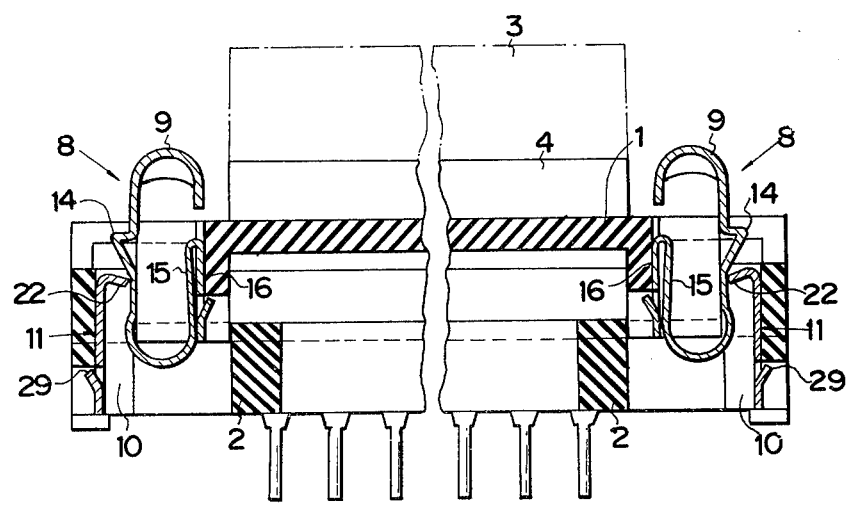
FIG. 4A is an enlarged sectional view along line 4A—4A of FIG. 3 showing the release position of lock members.
Figure 5A:
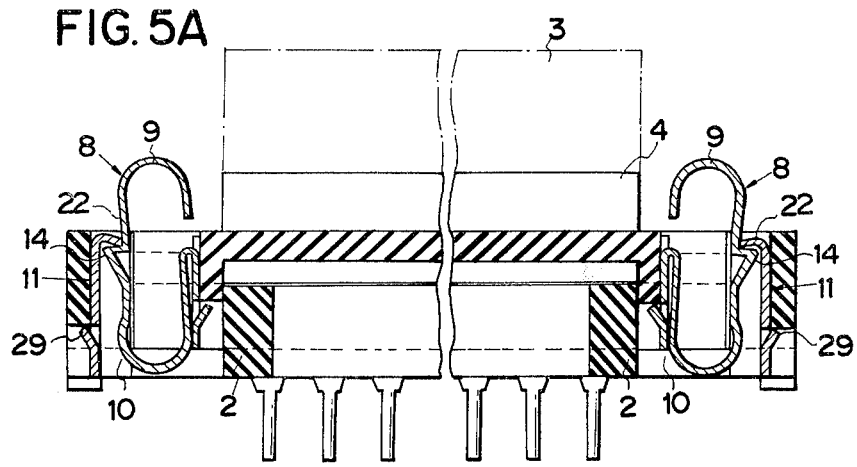
FIG. 5A is a view similar to FIG. 4A showing the locked position of the lock members.

To lock the base plate 1 with the connector plate 2, the base plate 1 is placed on the connector plate 2 as shown in FIG. 4A such that a portion of each lock member 8 projects into the mounting recess 10 of the connector plate 2 and the guide recess 25 of the base plate 1 engages over the guide wall 24 of the connector plate 2. Then the base plate 1 is pushed downwards. Thus, the lock member 8 is further projected into the mounting recess 10 of the connector plate 2 as shown in FIG. 5A, until the step portion 14 passes under the retainer element 22 of the retainer 11. By the elastic force of the lock member 8, the step portion 14 firmly engages with the retainer element 22 so that the base plate 1 is locked to the connector plate 2.

Figure 4B:
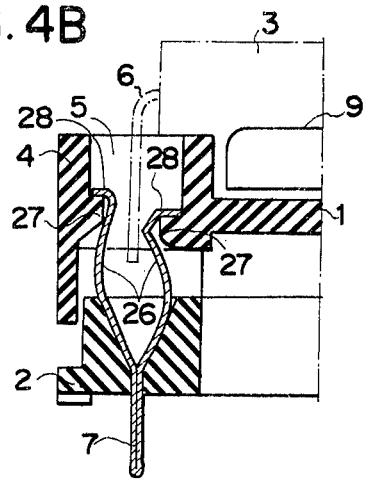
FIG. 4B is an enlarged sectional view along line 4B—4B of FIG. 3 showing release position of contact from lead wire of IC package.
Figure 5B:
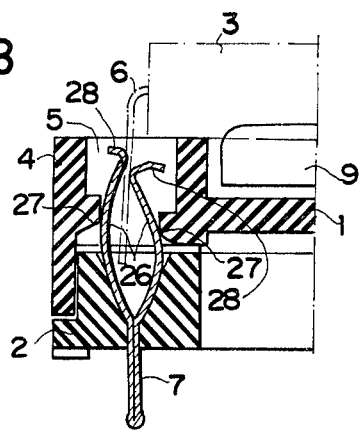
FIG. 5B is a view similar to FIG. 4B showing the engaged position of a contact with a lead wire.

As shown in FIGS. 4B and 5B, each contact 7 is secured to the connector plate 2 and projects from the lower face of the plate 2. The upper portion of the contact 7 has two elastic lead contact elements 26. When the base plate 1 is locked with the connector plate 2 as shown in FIG. 5B the lead contact elements 26 close to engage with a lead wire 6 on the IC package 3, and when the base plate 1 is moved upward from the connector plate 2 as shown in FIG. 4B, the lead contact elements 26 are elastically separated each other free from the lead wire 6.

More specifically, means to open and close the contact elements 26 is constituted by projections 27 projecting from the inner surfaces of the through hole 5 of the base plate 1. The contact elements 26 project from upper surface of the connector plate 2. Thus, when the base plate 1 is not locked as shown in FIG. 4B, the contact elements 26 of the contact 7 remain open so that the IC package 3 can be placed without the use of any downward force. When the base plate 1 pushed downwards the projections 27 urge curved surfaces of the contact elements 26 toward each other so that free ends of the contact elements 26 are closed against the lead wire 6 of the IC package against the elastic force of the elements 26. As shown, each contact element 26 is curved outwardly such that the projection 27 progressively urges the contact element 26 inwardly when the base plate 1 is pushed downwards. As shown, the upper end 28 of each contact element 26 is bent outwardly to form an engaging element 28 which engages with upper surface of the projection 26 when the base plate 1 is in the uppermost position shown in FIG. 4B. Thus, the base plate 1 is not separated completely from the connector plate 2 in ordinary operations.

In operation, an electronic unit 3, e.g. an IC package is placed on the rests 4 on the base plate 1 and the lead wires 6 are extend through the through openings 5 of the base plate 1. As the base plate 1 is in the open position shown in FIGS. 4A and 4B, the lead wires 6 project freely into the through openings 5 between the now open contact elements 26 as shown in FIG. 4B.

Then the base plate 1 is pushed downwards toward the connector plate 2 to the lock position shown in FIGS. 5A and 5B. As the projections 27 in each through hole 5 progressively urge the curved surfaces of each contact element 26, free ends of the contact elements 26 draw nearer until the free ends contact the lead wire 6. When the base plate 1 is locked to the connector plate 2, the contact elements 26 of each contact 7 are urged firmly against the lead wire 6.

Meanwhile, as the base plate 1 is pushed downwards toward the connector plate 2 from the position shown in FIG. 4A to the position shown in FIG. 5A, the lock members 8 are moved downwards in the engaging recess 10 until the step portion 14 of the lock member 8 snaps under the retainer element 22 of the retainer 11. Thus, the base plate 1 is locked to the connector plate 2 and lead wires 6 of the IC package 3 are held firmly between the contact elements 26 of the contacts 7.

To release the IC package 3 from the base plate 1, the finger operating portions 9 are urged longitudinally inwardly by the fingers of the operator. Thus, the lock members 8 are elastically bent inwards and the stepped portions 14 are released from the retainer element 22 of the retainer 11. When the lock members 8 are released from the retainer 11, elastic force of the contact elements 26 of the contacts 7 moves the base plate 1 away from the connector plate 2 and the contact elements 26 are separated from the lead wire 6. Thus, the IC package 3 can be freely removed from the base plate 1.

It will be appreciated that the electronic unit, e.g. an IC package, can be readily and easily engaged with and released from the connector socket. As the lead wires 6 are urged sidewise by the contact elements 26 and no relative sliding movement between the lead wires and the contacts occurs, no wear occurs on the surfaces of the lead wires 6 and the contact elements 26 so that the service life of the contacts 7 is greatly increased, and good contact quality is maintained for a longer period as compared with the known sliding contact type connector sockets. The feature is obtained by vertical relative movement between the base plate 1 and the connector plate 2, in place of the known relative lateral movement.

What is claimed is:

1. A socket for an electronic unit having a plurality of wires depending therefrom, said socket comprising:
   a base plate having at least one row of vertical openings therein for receiving corresponding lead wires from the electronic unit;
   a connector plate having at least one row of contacts and on which said base plate is mountable with the openings aligned with said contacts and the contacts extending into said openings, said base plate and said connector plate being movable toward and away from each other between contact engagement and release positions of said contacts and the lead wires of the electronic unit on said base plate with the lead wires extending through said openings;
   a pair of resilient lock members, one at each of the opposite end portions of said base plate and having one portion normally resiliently urged away from said end portions of said base plate;
   a pair of retainers, one at each of the corresponding opposite end portions of said connector plate, and said one portion of each resilient lock member having a retainer engaging means engageable with the corresponding retainer by the resilient urging of said one portion away from said end of said base plate when said base plate is at said engagement position; and
   said lock members each having a finger operating portion projecting upwardly from the upper surface of said base plate and movable toward the corresponding ends of said base plate to release said retainer engaging means from said retainers;
   said row of openings being located in said base plate for causing an electronic unit to be positioned between said finger operating portions with the electronic unit adjacent said finger operating portions when the electronic unit is mounted on the base plate with the depending lead wires extending into said openings, whereby when said finger operating portions of said lock members are moved toward each other to release the lock members from said retainers, the electronic unit is gripped between the fingers of the operator.

2. A socket as claimed in claim 1 in which said resilient lock members are each an elastic metal plate bent into a U-shape and said retainer engaging means is a stepped portion projecting away from the base plate for engaging under the corresponding retainer.

3. A socket as claimed in claim 1 in which said finger operating portions are each an inverted U-shape plate portion.

4. A socket as claimed in claim 1 in which said contacts are laterally elastically deformable into contact with and disengagement from the lead wires when said base plate is moved into the contact engagement position, and said contacts include means for preventing said base plate from being moved away from said connector plate in the direction of the release position more than a predetermined distance.

5. A socket as claimed in claim 4 in which said contacts each having two elastic contact elements which are urged toward the lead wire extending between them when said base plate is in the contact engagement position, and said contact elements each have a retaining means at the upper free end thereof extending away from the other contact element and overlying a portion of said base plate around the corresponding vertical opening.

* * * * *